(12) United States Patent
Kumar et al.

(10) Patent No.: US 6,759,624 B2
(45) Date of Patent: Jul. 6, 2004

(54) METHOD AND APPARATUS FOR HEATING A SEMICONDUCTOR WAFER PLASMA REACTOR VACUUM CHAMBER

(76) Inventors: Ananda H. Kumar, 1999 Blackfoot Dr., Fremont, CA (US) 94539; Tetsuya Ishikawa, 20072 Kilbride Dr., Saratoga, CA (US) 95070; Kwok Manus Wong, 1636 Larkin Ave., San Jose, CA (US) 95129; Farahmand E. Askarinam, 1332 Pauline Dr., Sunnyvale, CA (US) 94087

( * ) Notice: Subject to any disclaimer, the term of this patent is extended or adjusted under 35 U.S.C. 154(b) by 70 days.

(21) Appl. No.: 10/141,025

(22) Filed: May 7, 2002

(65) Prior Publication Data

US 2003/0209526 A1 Nov. 13, 2003

(51) Int. Cl.⁷ .................................................. B23K 9/00
(52) U.S. Cl. ................................... 219/121.36; 219/270
(58) Field of Search ....................... 219/121.36, 121.52, 219/121.57, 121.59, 270

(56) References Cited

U.S. PATENT DOCUMENTS

| | | | | |
|---|---|---|---|---|
| 3,875,477 A | * | 4/1975 | Fredriksson et al. | 219/270 |
| 4,502,278 A | * | 3/1985 | Stark | 60/303 |
| 5,514,630 A | | 5/1996 | Willkens et al. | 501/89 |
| 5,820,789 A | | 10/1998 | Willkens et al. | 252/516 |
| 5,892,201 A | | 4/1999 | Croucher et al. | 219/267 |
| 5,968,587 A | | 10/1999 | Frankel | 427/8 |
| 6,019,848 A | | 2/2000 | Frankel et al. | 118/715 |
| 6,028,292 A | | 2/2000 | Willkens et al. | 219/270 |
| 6,080,970 A | | 6/2000 | Yoshida et al. | 219/444.1 |
| 6,189,483 B1 | | 2/2001 | Ishikawa et al. | 118/723 E |
| 6,543,362 B1 | * | 4/2003 | Muskat | 102/202 |
| 2002/0113051 A1 | * | 8/2002 | Wilkens et al. | 219/270 |

OTHER PUBLICATIONS

Web Article: www.infraredheaters.com/ceramic.htm "Salamander Ceramic Infrared Heating Elements", 10 pages.
Web Article: www.powermodulesinc.com/radiantheaters.html "Radiant Heaters Speed Manufacturing Process", 3 pages.

Web Article: www.ceramicx.com/newpage2.htm "What Are Ceramic Infrared Heaters", 2 pages.
Web Article: www.ceramicx.com/ceramic.htm "Ceramic Infrared Products", 5 pages.
Web Article: www.infraredheaters.com/indust.htm Industrial Processing Heaters, 2 pages.
Web Article: www.therma–tech.com/Products/ProdMain.htm "Broad Range Of Infrared Heaters", 2 pages.
Web Article: www.infraredheaters.com/drying.htm "Drying And Evaporation", 3 pages.
Web Article: www.nfesc.navy.mil/pub_news/tds/7337tds.htm "Infrared Radiant Heating", 2 pages.
Web Article: www.nortonigniters.com/products.html "Igniter Products", 1 page.
Web Article: www.nortonigniters.com/crystar_igniters.html "Crystar Igniters", 2 pages.
Web Article: www.nortonigniters.com/answers.html "Igniter Products—Answers", 4 pages.
Web Article: www.hotwatt.com/ceramic.htm "HOTWATT Heaters For Every Application", 4 pages.
Web Article: www.zmd.com/Tower.htm "The Tower Machine TWR–900 Series", 2 pages.
Web Article: www.zmd.com/overview.htm "Overview", 5 pages.
Web Article: jem.tksc.nasda.go.jp/kibo/kibomefc/afex_g_e.htm "Advanced Furnace For Microgravity Experiments With X–Ray Radiography", 3 pages.
Web Article: jem.tksc.nasda.go.jp/kibo/kibomefc/afex-spec.html "Advanced Furnace For Microgravity Experiments With X–Ray Radiography", 9 pages.

* cited by examiner

*Primary Examiner*—Tu Ba Hoang
(74) *Attorney, Agent, or Firm*—Joseph Bach; Olive & Olive

(57) ABSTRACT

A vacuum chamber, such as a semiconductor wafer plasma processing chamber, is heated by use of a ceramic igniter array consisting of a plurality of ceramic igniters positioned in a substrate.

17 Claims, 1 Drawing Sheet

METHOD AND APPARATUS FOR HEATING A SEMICONDUCTOR WAFER PLASMA REACTOR VACUUM CHAMBER

BACKGROUND OF THE INVENTION

1. Field of the Invention

The present invention relates to an apparatus and method for heating a vacuum chamber. The present invention further relates to an apparatus and method for heating a semiconductor wafer plasma processing chamber under a vacuum to keep process components at desired temperatures and achieve desirable processing results from such heating.

2. Description of Related Art

One problem encountered in semiconductor wafer fabrication in both the etching and CVD process is that of maintaining a uniform temperature across the semiconductor wafer surface. As a semiconductor wafer is processed, there exists a significant heat load due to plasma radiation and ion bombardment of the semiconductor wafer surface. When a temperature gradient exists across the semiconductor wafer surface, the deposition of a film using a plasma can proceed in a non-uniform manner. Therefore, it is important to precisely control the temperature across the semiconductor wafer surface especially as a semiconductor wafer size increases, e.g., to 300 mm, because temperature uniformity over the larger area becomes even more difficult to achieve.

Another serious problem during semiconductor wafer processing using a plasma is created by deposition of material in the chamber. During processing, material can deposit throughout the chamber, on the semiconductor wafer support member, on the gas distribution components, and on the chamber walls. Over time, such material build-up can flake off into the vacuum chamber resulting in particle contamination on the semiconductor wafer, which can compromise the integrity of the devices being fabricated. Thus, the chamber must be periodically cleaned. A favored method of cleaning is to introduce cleaning gases into the chamber to react with the deposited material to form a product which can be exhausted from the chamber. Typically, a cleaning gas, such as an oxygen and fluorinated gas, is introduced into the vacuum chamber and plasma is struck in the chamber. The resultant excited products react with the deposition material to form gas phase byproducts which are then exhausted from the vacuum chamber. A problem with this process is that cleaning is typically localized in regions adjacent to the plasma. In order to enhance cleaning of all exposed vacuum chamber surfaces, the time period in which the cleaning process is performed is increased, thereby decreasing throughput, and/or the cleaning process is performed using high temperatures thereby effectively cleaning some of the vacuum chamber surfaces and increasing the cost of consumables and/or maintenance intervals. Heating the vacuum chamber to temperatures in the range of 120° to 250° C. during semiconductor wafer etching can significantly prevent polymer accumulation without further cleaning.

Up to this point, semiconductor wafer manufacturing has used two different approaches to provide heat to plasma chambers in an attempt to solve problems known to be solved using heat. The first approach has been the use of quartz lamps. A series of quartz lamps work cooperatively together to provide an even uniform radiant energy source for heating of components in the plasma vacuum chamber. Quartz lamps can produce temperatures of between 1000° C. and 1500° C. in a matter of seconds. However, several problems exist with quartz lamps. Quartz lamps are typically bulky and take up substantial room, thus making it necessary to use a larger plasma chamber than would otherwise be desirable. Since quartz lamps are made of fragile glass, they are prone to breakage if not handled in a delicate manner. Also, quartz lamps cannot be used in a vacuum inside the chamber and are sensitive to severe etching if exposed to the typical fluorine plasma used in the semiconductor wafer plasma process. Because quartz lamps are essentially unsuitable for use inside the plasma process vacuum chamber they are typically used while being located external of the chamber.

The second approach for providing heat to plasma chambers has been to use heaters with embedded metal elements which typically are located inside typical fluorine plasma semiconductor wafer process vacuum chambers. These embedded metal heaters consist of a patterned metal, embedded in a substrate such as a ceramic-like aluminum nitride. The substrate with this type of heater provides protection of the heater from the environment in the process vacuum chamber and also provides even heat which works well in a vacuum environment. These types of heaters, however, are not radiant. They take considerable time to reach an operating temperature and need to be in direct contact with the object to be heated, either physically touching the object or contacting it through a medium such as a fluid, to heat the object.

Ceramic igniters are heating elements widely used in industrial and residential gas burners to ignite natural gas. They typically are formed with a heating element made of one or more ceramic materials such as silicon carbide, silicon nitride, and aluminum nitride and can be heated to high temperatures of around 1200° C. to 1400° C. extremely rapidly by passing a DC current through them. These types of heaters are solid state, compact radiant heat providers, and can operate in a vacuum. Ceramic igniter heaters are stand-alone heaters which can be selectively heated in a local area or uniformly to high temperatures by use of a DC current.

It can be seen from the foregoing description of art relating to vacuum chamber heating that numerous problems occur with such heating, and they are particularly troublesome in the context of a plasma vacuum chamber during processing of a semiconductor wafer. The problems include difficulty heating the vacuum chamber rapidly and evenly. They also include a need for less fragile heaters which are not affected by conditions present in vacuum chambers such as semiconductor plasma reactor vacuum chambers.

It is thus an object of this invention to provide high temperature heating to a vacuum chamber. It is also an object of this invention to provide high temperature heating to a semiconductor wafer plasma chamber under vacuum and in a manner which overcomes the disadvantages and problems associated with current semiconductor wafer processing technology.

Other objects will become apparent as the description proceeds.

SUMMARY OF THE INVENTION

The present invention resides in the discovery that the problems described above can be reduced or eliminated by an innovative use of ceramic igniters within an enclosed vacuum chamber such as the vacuum chamber of a semiconductor wafer plasma reactor during processing.

As previously mentioned, the enclosed vacuum chamber of a semiconductor wafer plasma reactor typically comprises a floor, a ceiling, and sidewall. A vacuum pump is attached to the chamber in order that processing, e.g., etch or deposition can be accomplished under a vacuum. A support member, such as a chuck, platform or the like, is positioned in the chamber and is designed to accept the mounting of a semiconductor wafer for processing.

Heating according to the invention is accomplished via a ceramic igniter array assembly. The ceramic igniter array assembly comprises a plurality of electrically energized ceramic igniters. The igniters preferably are mounted in a suitable substrate which is placed, during use, inside the vacuum chamber. Typically, this substrate is a ceramic material such as silicon carbide, silicon nitride, or aluminum nitride, but could also include materials such as stainless steel. The ceramic igniters are energized through use of a controller positioned outside the plasma chamber. If a plurality of ceramic igniters are used then the controller energizes the ceramic igniters simultaneously or in a pre-designated sequence by applying a DC voltage thereto, when desired, which causes the igniters to heat according to a so-called "duty cycle" i.e. the on/off cycle of the igniters during processing of a wafer in a plasma chamber.

The exact number and size of the ceramic igniters that will form the ceramic igniter array assembly, as well as their placement within the vacuum chamber and in any substrate, will vary according to the size of the vacuum chamber and the placement of objects in the chambers such as semiconductor wafers, the gas plasma chosen, gas plasma pressure, size, shape and orientation of the vacuum chamber and its components. Further, ceramic igniters can be obtained that heat uniformly across their surface or selectively in a local area such as their tips. Where the shape and size of the ceramic igniters does not render it inherently stable, placing the ceramic igniter in a substrate, such as a ceramic material, ensures that the igniters remain stable. Such a substrate as well as spacers, potting material and/or the like also may be used as needed to achieve a stable mounting and configuration. The heating element of the ceramic igniters that actually provides heat is formed of a ceramic material and includes materials such as doped silicon carbide, silicon nitride, or aluminum nitride.

An exemplary embodiment of the invention involves the placement of a plurality of ceramic igniters in a circular ceramic ring (the substrate). The ring in this example fits around the outside of the semiconductor wafer support member.

The entire ceramic igniter array assembly can be positioned under what is known in semiconductor wafer processing as a process kit or around the semiconductor wafer support member such as in an electrostatic chuck. The controller is connected to the ceramic igniter and provides a source of DC voltage and thus a source of DC current. The controller is positioned outside of the chamber and through the incorporation of temperature sensors, relays coupled to switches and the like, regulates the duty cycle, that is the on/off regulation of the DC current supplied to the ceramic igniters.

According to an exemplary embodiment of the invention, there is provided a semiconductor wafer processing system comprising an enclosed plasma processing vacuum chamber, a support member for mounting a semiconductor wafer positioned within the plasma processing vacuum chamber, a ceramic igniter array assembly comprising a plurality of ceramic igniters mounted in a substrate and positioned inside the plasma processing vacuum chamber, and a controller positioned outside of the enclosed chamber and connected to the ceramic igniters for controlling the duty cycle of the ceramic igniters.

Yet another method of processing a semiconductor wafer comprises positioning a semiconductor wafer in the vacuum chamber of a semiconductor wafer processing system, introducing heat into said vacuum chamber by energizing a ceramic igniter array assembly comprising a plurality of ceramic igniters mounted in a substrate inside said plasma processing vacuum chamber, introducing a vacuum into said plasma processing vacuum chamber and introducing into said chamber conditions suitable for deposition or etching of the semiconductor wafer.

The invention in a broad sense includes a vacuum chamber and a ceramic igniter array assembly for heating the chamber comprising a plurality of electrically energized ceramic igniters mounted in a substrate positioned inside said vacuum chamber and for any application.

As a result of the discoveries of the invention, it is clear that the problems associated with heating to a high temperature in a vacuum chamber have been greatly reduced or eliminated.

DETAILED DESCRIPTION OF EXEMPLARY EMBODIMENT

Figure 1:
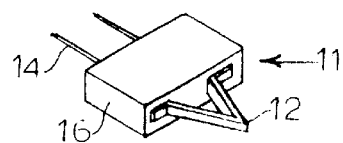
FIG. 1 is a perspective view of a single ceramic igniter of a type used in the ceramic igniter array of the exemplary embodiment.

FIG. 1 is a perspective view of a single ceramic igniter 11 of a type used in the exemplary embodiment of invention. Ceramic igniter 11 comprises a ceramic base 16 supporting an electrically energized ceramic heating element 12. Element 12 is connected through wires 14 to a DC voltage source such as controller 36 (shown in FIG. 3) and which provide an adjustable DC current for heating element 12.

Figure 2:
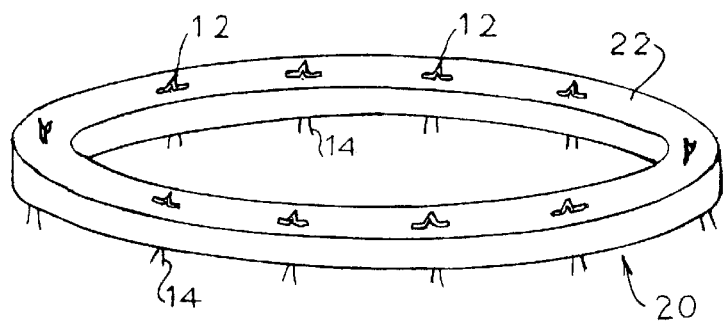
FIG. 2 is a perspective view of a ceramic igniter array comprising a circular substrate with a plurality of ceramic igniters positioned therein according to the exemplary embodiment.

FIG. 2 is a perspective view of an exemplary embodiment of a ceramic igniter array assembly 20 of the invention. In the exemplary embodiment, ceramic igniter array assembly 20 consists of a circular substrate 22 formed of a ceramic material and in which a plurality of ceramic igniters 11 are embedded. In the exemplary embodiment shown in FIG. 2, ten embedded ceramic igniters 11 are shown by way of example positioned equally spaced apart in the circular substrate 22. Each ceramic igniter 11 has a pair of electrical wires 14 protruding from the bottom of circular substrate 22 for connection to an adjustable DC voltage source to energize the ceramic igniters 11.

Figure 3:
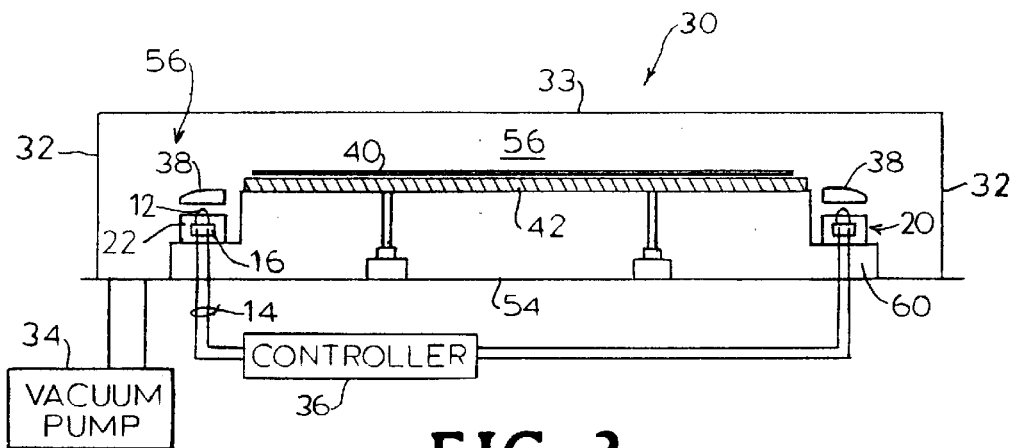
FIG. 3 is a cross-sectional schematic view of a semiconductor wafer processing vacuum chamber showing a chuck, semiconductor wafer, process kit, and a ceramic igniter array of the type illustrated in FIG. 2.

FIG. 3 is an schematically illustrated cross-sectional views of a semiconductor wafer processing system 30. Semiconductor wafer processing system 30 provides a cylindrical plasma processing vacuum chamber 56 comprising side walls 32, ceiling 33 and a floor designated as a support body 54, which may comprise a thermally conducting material to facilitate cooling after system 30 has been heated. Plasma processing vacuum chamber 56 supports a vacuum created by a vacuum pump 34.

If desired, a voltage, usually around 100–1000 volts DC, can be suitably applied to appropriate components of semiconductor wafer processing system 30 by a separate DC voltage source (not shown) to generate an electrostatic attraction force that can hold wafer 40 on support member 42 and is referred to as an "electrostatic chuck". An annular mounting flange 60 extends outwardly above the outer surface of support body 54. Ceramic igniter array assembly 20 is supported by annular mounting flange 60. Ceramic igniter array assembly 20 as previously referred to in FIG. 2, consists of substrate 22 in which are embedded plural ceramic igniters 11 having electrical connection wires 14, which provide a path for DC current flow from controller 36, each of which ceramic igniters comprises a base 16 and a ceramic heating element 12. Immediately above ceramic igniter array assembly 20 is schematically illustrated process kit 38 which encircles support member 42. The process kit 38 is primarily used to protect the electrostatic chuck and cathode from the effects of the plasma, and heating of the process kit components enhances its cleaning effect.

The foregoing is directed to exemplary embodiments of the invention. Other and further embodiments of the invention may be devised without departing from the basic scope herein and the scope of the claims which follow. Such changes may include change of size and shape in the ceramic igniter array, the substrate, the number of ceramic igniters and type of vacuum chamber receiving placement of the ceramic igniter array assembly. Therefore, the above should not be construed as limiting the invention as

What is claimed is:

1. A semiconductor wafer processing system comprising:
   (a) an enclosed plasma processing vacuum chamber;
   (b) a support member for mounting a semiconductor wafer in said chamber;
   (c) a ceramic igniter array assembly having a plurality of spaced apart electrically energized ceramic igniters mounted in a substrate positioned within said chamber; and
   (d) a controller located externally of said chamber and connected to energize and control the duty cycle of said ceramic igniters.

2. A semiconductor wafer processing system according to claim 1 wherein each of said ceramic igniters comprises a heating element made from a ceramic material comprising doped silicon carbide, silicon nitride or aluminum nitride.

3. A semiconductor wafer processing system according to claim 1 wherein said substrate is made of a ceramic material.

4. A semiconductor wafer processing system according to claim 1 wherein said substrate is formed as a ring having said igniters evenly positioned therein.

5. A semiconductor wafer processing system according to claim 1 further comprising a process kit positioned both around said support member and in a position which enables said ceramic igniter array assembly to heat said process kit.

6. A ceramic igniter array heating assembly comprising a plurality of electrically energizable ceramic igniters mounted spaced apart in a substrate mounted in a vacuum chamber of a semiconductor wafer processing system.

7. An igniter array heating assembly according to claim 6 wherein each of said igniters includes a heating element comprised of doped silicon carbide, silicon nitride or aluminum nitride.

8. A ceramic igniter array heating assembly according to claim 6 wherein said substrate comprises a ceramic material.

9. A ceramic igniter array heating assembly according to claim 6 wherein said substrate is circular shaped, said ceramic igniters are mounted evenly spaced around said substrate and said substrate is adapted to be mounted to encircle a support member for a semiconductor wafer to be processed in said vacuum chamber.

10. A ceramic igniter array heating assembly according to claim 6 further comprising a controller located outside of said chamber and connected to both energize and control the duty cycle of said ceramic igniters.

11. A method of processing a semiconductor wafer comprising:
   (a) positioning a semiconductor wafer on a support member in an enclosed chamber forming a component of a semiconductor wafer plasma processing system;
   (b) positioning within said chamber a ceramic igniter array comprising a plurality of spaced apart electrically energized ceramic igniters mounted in a substrate;
   (c) establishing a vacuum within said chamber; and
   (d) electrically energizing said igniters to heat said chamber.

12. A method of processing a semiconductor wafer as claimed in claim 11 including the steps of introducing a gas into said chamber capable of etching or depositing on said wafer.

13. A method of processing a semiconductor wafer according to claim 11 wherein said ceramic igniter array is shaped and positioned so as to encircle said support member.

14. A method of processing a semiconductor wafer according to claim 11 wherein said ceramic igniter array is energized by means of a controller adapted to apply an adjustable DC voltage across said ceramic igniter array.

15. A heating system, comprising a ceramic igniter array having a plurality of spaced apart electrically energized ceramic igniters positioned within an enclosed vacuum chamber.

16. A heating system according to claim 15, wherein said ceramic igniters are mounted in a substrate.

17. A heating system according to claim 16, wherein said substrate is a ceramic material.

* * * * *